(12) United States Patent
Oh et al.

(10) Patent No.: US 9,460,930 B2
(45) Date of Patent: Oct. 4, 2016

(54) METHOD FOR PERFORMING LASER CRYSTALLIZATION

(71) Applicant: SAMSUNG DISPLAY CO., LTD., Yongin, Gyeonggi-Do (KR)

(72) Inventors: Nang-Lyeom Oh, Yongin (KR); Je-Kil Ryu, Yongin (KR); Alexander Voronov, Yongin (KR); Gyoo-Wan Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 26 days.

(21) Appl. No.: 14/159,386

(22) Filed: Jan. 20, 2014

(65) Prior Publication Data

US 2015/0017816 A1 Jan. 15, 2015

(30) Foreign Application Priority Data

Jul. 10, 2013 (KR) .......................... 10-2013-0081177

(51) Int. Cl.
  *H01L 21/00* (2006.01)
  *H01L 21/268* (2006.01)
  *B23K 26/06* (2014.01)
  *H01L 21/02* (2006.01)

(52) U.S. Cl.
  CPC ......... *H01L 21/268* (2013.01); *B23K 26/0648* (2013.01); *H01L 21/02532* (2013.01); *H01L 21/02675* (2013.01); *H01L 21/02691* (2013.01)

(58) Field of Classification Search
  None
  See application file for complete search history.

(56) References Cited

U.S. PATENT DOCUMENTS

| 4,344,671 A * | 8/1982 | Lang .............................. 359/618 |
| 6,002,522 A * | 12/1999 | Todori et al. ................. 359/573 |
| 2003/0142718 A1* | 7/2003 | Hayakawa .......... H01S 5/32341 372/108 |
| 2004/0183133 A1* | 9/2004 | Takafuji et al. .............. 257/347 |
| 2007/0037318 A1* | 2/2007 | Kim .............................. 438/106 |
| 2010/0278480 A1* | 11/2010 | Vasylyev ........................ 385/33 |

FOREIGN PATENT DOCUMENTS

| JP | 10-133243 | 5/1998 |
| JP | 2000-187108 | 7/2000 |
| KR | 10-0742380 | 7/2007 |

OTHER PUBLICATIONS

English Abstract for Publication No. 10-2007-0069603 (for 10-0742380).

\* cited by examiner

*Primary Examiner* — Calvin Choi
(74) *Attorney, Agent, or Firm* — F. Chau & Associates, LLC

(57) ABSTRACT

A method for performing a laser crystallization is provided. The method includes generating a laser beam, refracting the laser beam to uniformize an intensity of the laser beam at a focal plane of the laser beam. The laser beam whose intensity is uniformized is applied into an object substrate mounted with a stage.

16 Claims, 7 Drawing Sheets

METHOD FOR PERFORMING LASER CRYSTALLIZATION

CROSS-REFERENCE TO RELATED APPLICATION

This application claims priority to Korean Patent Application No. 10-2013-0081177, filed on Jul. 10, 2013, in the Korean Intellectual Property Office, the disclosure of which is herein incorporated by reference in its entirety.

TECHNICAL FIELD

The present invention relates to laser crystallization, and more particularly, to method for performing a laser crystallization.

DISCUSSION OF THE RELATED ART

An amorphous silicon (a-Si) may be disadvantageous for use in complementary metal-oxide-semiconductor (CMOS) process on account of its low mobility of electrons (i.e., electrical charge carriers) and a low aperture ratio. Accordingly, the amorphous silicon (a-Si) may not be appropriate for a complementary metal-oxide-semiconductor (CMOS) process. A polycrystalline silicon (poly-Si) thin film element may make it possible to configure a driving circuit, required for writing an image signal in pixels, on a substrate such as a pixel thin film transistor (TFT)-array. The polycrystalline silicon thin film element may increase productivity and reliability in manufacturing a display panel and reduce thickness of the display panel because the polycrystalline silicon thin film element does not require connections between a plurality of terminals and a driver IC.

Crystallization methods may be used for manufacturing a polysilicon thin film transistor in a low temperature condition such as solid phase crystallization (SPC), metal induced crystallization (MIC), metal induced lateral crystallization (MILC), or excimer laser annealing (ELA). The excimer laser annealing (ELA) used to perform crystallization by using a high energy laser beam may be used in a process for manufacturing an organic light-emitting diode (OLED) or a liquid-crystal display (LCD).

As described above, when performing the crystallization to an object thin film while scanning an object substrate by using the laser crystallization apparatus, a scan mura (i.e., a spot) may be generated due to a nonuniform intensity of a linear laser beam and a mechanical vibration at a high frequency may be applied to increase uniformity of the intensity of the laser beam.

However, since the mechanical vibration at a high frequency may be transmitted to the substrate to generate another mura. The mura generated by transmitted mechanical vibration at a high frequency may be a problem in a display device with a high resolution.

SUMMARY OF THE INVENTION

According to an exemplary embodiment of the present invention, a method for performing a laser crystallization is provided. The method includes generating a laser beam, refracting the laser beam to uniformize an intensity of the laser beam at a focal plane of the laser beam. The laser beam whose intensity is uniformized is applied into an object substrate mounted with a stage.

The refracting of the laser beam may be performed by using a refraction optical system and the refraction optical system may include a refraction lattice lens in which a refraction lattice including a plurality of grooves is formed at one surface thereof.

The refraction lattice may be a saw-toothed lattice and the plurality of grooves includes saw-toothed grooves.

A density of the saw-toothed grooves may be in a range from 50/mm to 350/mm.

A width of each of saw-toothed grooves may be in a range from 3 μm to 20 μm.

The refraction lattice may be a triangular lattice and a plurality of grooves includes triangular grooves.

A density of the triangular grooves may be in a range from 50/mm to 350/mm.

A width of each of triangular grooves may be in a range from 3 μm to 20 μm. The refraction lattice may be a quadrangular lattice and a plurality of grooves includes quadrangular grooves.

A density of the quadrangular grooves may be in a range from 50/mm to 350/mm.

A width of each of the quadrangular groove may be in a range from 3 μm to 20 μm.

A depth of each of the quadrangular groove may be in a range from 0.1 μm to 20 μm.

The method may include the vibrating the refraction optical system using a high frequency generator.

The frequency generated by the high frequency generator may be in a range from 60 Hz to 100 Hz.

The applying of the laser beam may include moving the stage to position the focal plane onto an object thin film formed at the object substrate.

The applying of the laser beam may include moving the refraction optical system to position the focal plane onto an object thin film formed at the object substrate.

BRIEF DESCRIPTION OF THE DRAWINGS

The present invention will be described more fully hereinafter with reference to the accompanying drawings.

DETAILED DESCRIPTION OF THE INVENTION

Figure 1:
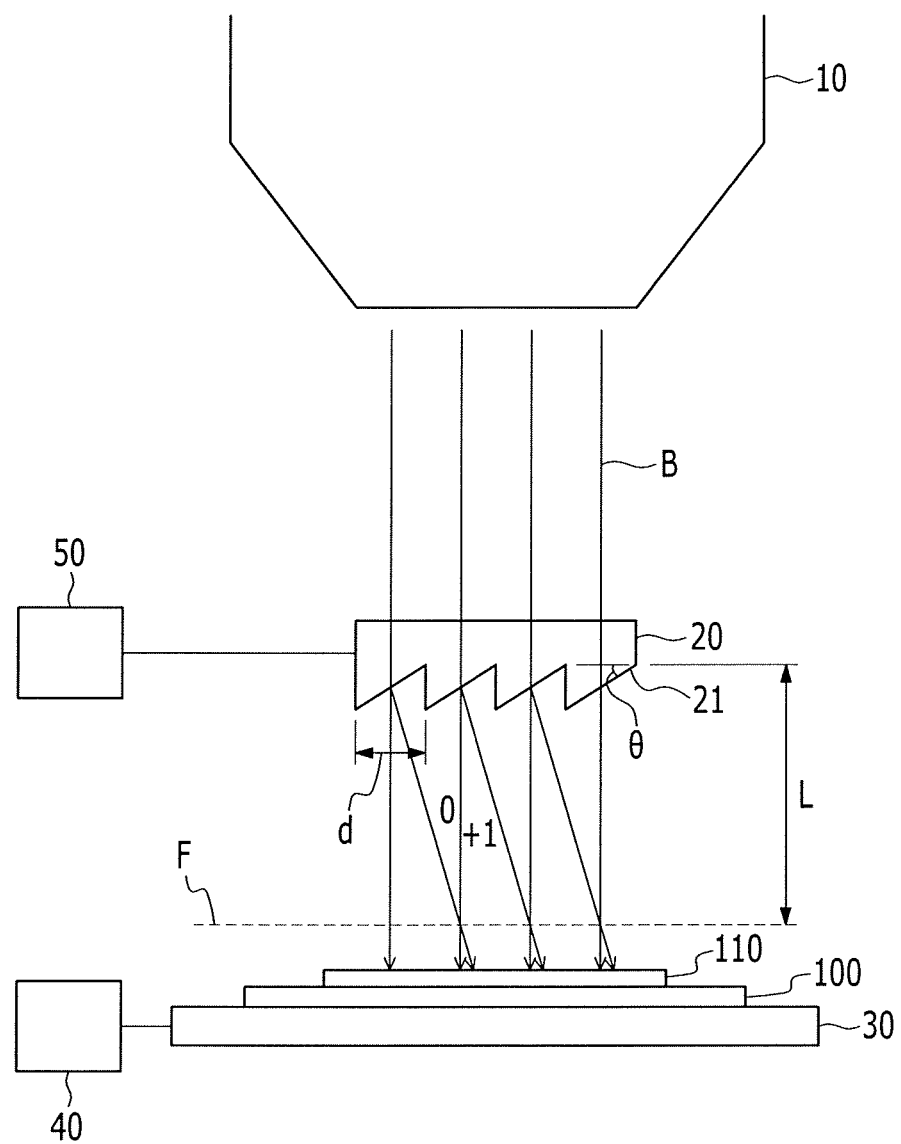
FIG. 1 is a schematic diagram of a laser crystallization apparatus according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify a description of the present invention, the same reference numbers may be used throughout the drawings to refer to the same or like parts.

Further, the size and thickness of each of the elements shown in the drawings may be exaggerated to enhance clarity.

Now, a laser crystallization apparatus according to an exemplary embodiment of the present invention will be described with reference to FIG. 1 and FIG. 2.

FIG. 1 is a schematic diagram of a laser crystallization apparatus 1 according to an exemplary embodiment of the present invention.

Referring to FIG. 1, a laser crystallization apparatus 1 according to an exemplary embodiment of the present invention may include a laser generator 10 configured to generate a laser beam B, a refraction optical system 20 configured to refract the laser beam B, a stage 30 mounted with an object substrate 100, a stage elevator 40 configured to move the stage 30, and a refraction optical system elevator 50 configured to move the refraction optical system 20.

The laser beam B may be incident to the object substrate 100 and crystallize an object thin film 110 formed at the object substrate 100. The laser beam B generated in the laser generator 10 may be an excimer laser beam. The object thin film 110 may be an amorphous silicon thin film and may be formed by low pressure chemical vapor deposition, atmospheric pressure chemical vapor deposition, plasma enhanced chemical vapor deposition (PECVD), sputtering, vacuum evaporation, or the like.

The refraction optical system 20 may be a refraction lattice lens. A refraction lattice 21 is formed on the refraction lattice lens. The refraction lattice 21 may include a plurality of grooves. The refraction lattice 21 may be a saw-toothed lattice 21 including a plurality of saw-toothed grooves, and the density of grooves in the saw-toothed lattice 21 may be 50/mm to 350/mm. When the density of grooves in the saw-toothed lattice 21 is less than 50/mm, it may be difficult to sufficiently refract the laser beam B to uniformize an intensity of a laser beam B. When the density of grooves of the saw-toothed lattices 21 is more than 350/mm, a manufacturing process may become difficult and the cost of manufacturing may increase. A width (d) of each groove of the saw-toothed lattice 21 may be in a range from 3 μm to 20 μm. When the width (d) of each groove of the saw-toothed lattice 21 is less than 3 μm, the manufacturing process may become difficult and the cost of manufacturing may increase. When the width (d) of each groove of the saw-toothed lattice 21 is larger than 20 μm, it may be difficult to generate the refraction.

The laser beam B incident to the refraction optical system 20 may be divided into a plurality of sub-laser beams (e.g., 0, +1) through the refraction optical system 20. When the refraction optical system 20 is the saw-toothed lattice 21, the laser beam B may be divided into a 0-th sub-laser beam 0 and a (+1)-th sub-laser beam +1.

Figure 2:
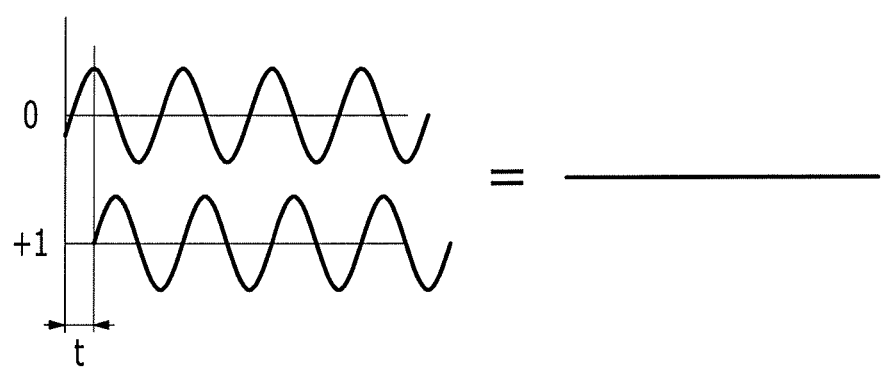
FIG. 2 is a view explaining destructive interference between sub-laser beams passing through a refraction optical system of a laser crystallization apparatus according to the exemplary embodiment of the present invention.

FIG. 2 is a view explaining a destructive interference of a laser beam B passing through the refraction optical system 20.

As shown in FIG. 2, a path difference t may be generated between the 0-th sub-laser beam 0 and the (+1)-th sub-laser beam +1 through the refraction optical system 20. When phases of the 0-th sub-laser beam 0 and the (+1)-th sub-laser beam +1 are opposite from each other at a focal plane F where the 0-th sub-laser beam 0 and the (+1)-th sub-laser beam +1 encounter, the destructive interference may be generated to uniformize the intensity of the laser beam B.

A distance L between the saw-toothed lattice 21 and the focal plane F may be changed by controlling the density of grooves in the saw-toothed lattice 21 and the width of the grooves in the saw-toothed lattice 21. Intensities of the 0-th sub-laser beam 0 and the (+1)-th sub-laser beam +1 may be changed by controlling an inclination 0 of the grooves in the saw-toothed lattice 21.

The object substrate 100 or the refraction optical system 20 may be moved using the stage elevator 40 and the refraction optical system elevator 50, respectively, in a depth of focus to position the focal plane F onto the object thin film 110 formed at the object substrate 100, and thus the intensity of the laser beam B may become uniform at the object thin film 110 where the focal plan F is positioned. FIGS. 3 (a) and (b) are graphs illustrating energy density of a laser beam according to a laser crystallization apparatus without a refraction optical system and energy density of a laser beam of a laser crystallization apparatus according to an exemplary embodiment of the present invention, respectively.

Figure 3A:
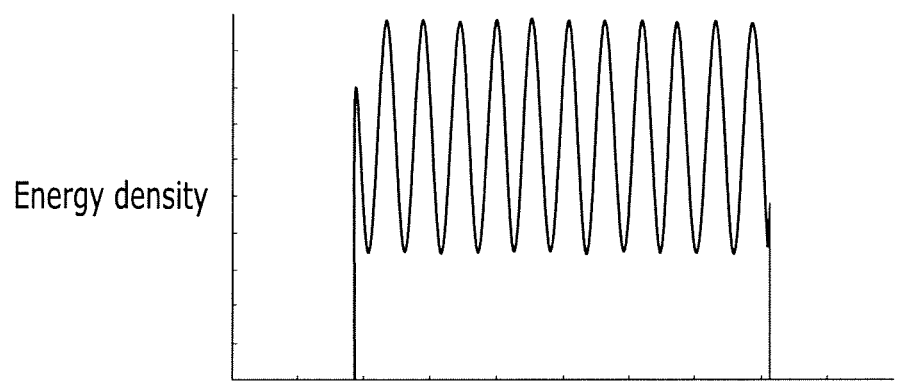
FIG. 3A and FIG. 3B are graphs of energy density of a laser beam in a laser crystallization apparatus according to the exemplary embodiment of the present invention and energy density of a laser beam according to a laser crystallization apparatus.
Figure 3B:
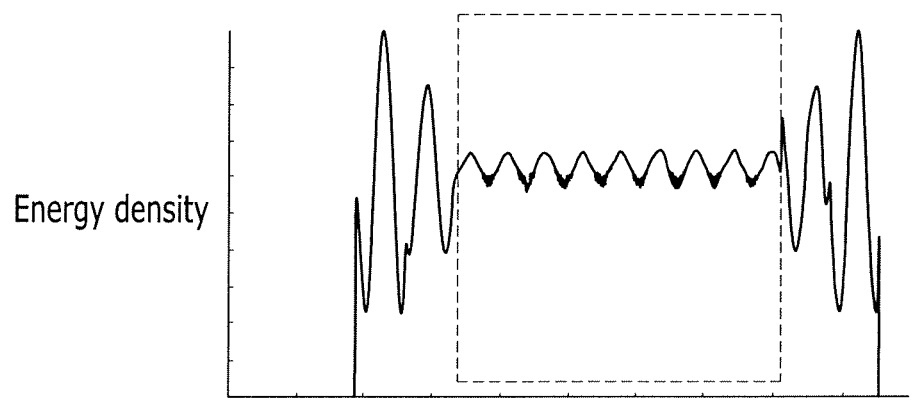

As shown in FIG. 3A, the energy density of the laser beam according to the laser crystallization apparatus without using the refraction optical system may be nonuniform. Referring to FIG. 3B, when the optical refraction system is incorporated to increase the energy density of the laser beam, a change of the energy density of the laser beam may be reduced and a scan mura during a crystallization process may be reduced due to the reduced change of the energy intensity of the laser beam.

The stage 30 may be moved toward the object thin film 110 and configured to scan the entire region of the object thin film 110.

Figure 4:
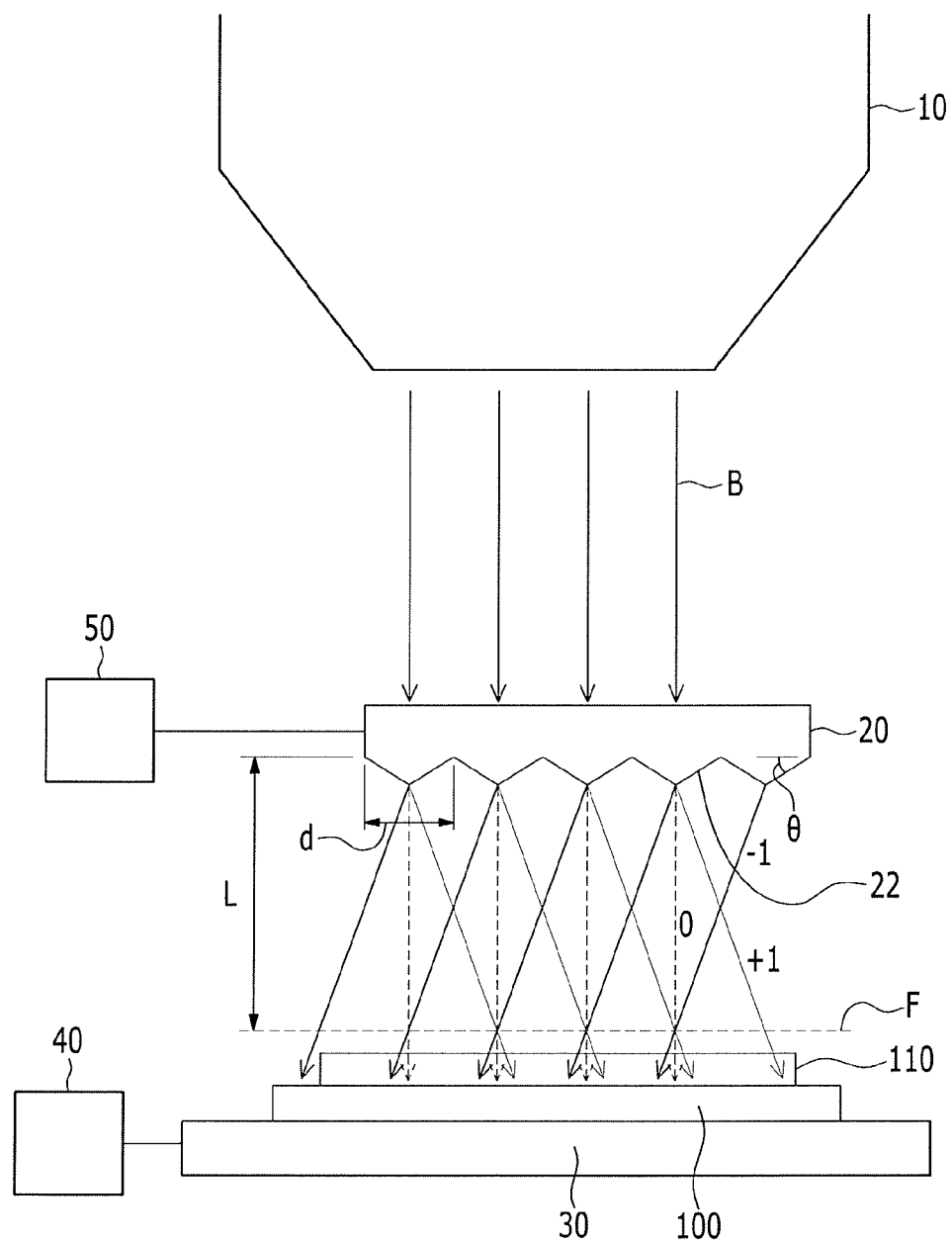
FIG. 4 is a schematic diagram of a laser crystallization apparatus according to an exemplary embodiment of the present invention.

FIG. 4 is a schematic diagram illustrating a laser crystallization apparatus 2 according to an exemplary embodiment of the present invention.

Referring to FIG. 4, a laser crystallization apparatus 2 according to an exemplary embodiment of the present invention may be equivalent to the laser crystallization apparatus 1 of FIG. 1 except for a shape of the refraction lattice, and accordingly a description of similar description may be omitted. However, the shape of the refraction lattice is not limited thereto. The laser crystallization apparatus 2 according to an exemplary embodiment of the present invention may include a triangular lattice 22 including a plurality of triangular grooves, and the density of grooves in the triangular lattice 22 may be in a range of 50/mm to 350/mm. When the density of grooves in the triangular lattice 22 is less than 50/mm, it may be difficult to sufficiently refract the laser beam B to uniformize the intensity of the laser beam B. When the density of grooves in the triangular lattice 22 is larger than 350/mm, the manufacturing process may become difficult and the cost of manufacturing may increase. A width (d) of each groove of the triangular lattice 22 may be in a range from 3 μm to 20 μm. When the width (d) of each groove of the triangular lattice 22 is less than 3 μm, the manufacturing process may become difficult and the cost of manufacturing may increase. When the width (d) of each groove in the triangular lattice 22 is larger than 20 μm, it may be difficult to generate the refraction.

The laser beam B incident to the refraction optical system 20 may be divided into a plurality of sub-laser beams (e.g., 0, +1) through the refraction optical system 20. When the refraction optical system 20 is the triangular lattice 22, the laser beam B may be divided into a 0-th sub-laser beam 0, a (+1)-th sub-laser beam +1, and a (−1)-th sub-laser beam −1.

A path difference may be generated among the 0-th sub-laser beam 0, the (+1)-th sub-laser beam +1, and the (−1)-th sub-laser beam −1 through the refraction optical system 20. When the phases of the 0-th sub-laser beam 0, the (+1)-th sub-laser beam +1, and the (−1)-th sub-laser beam −1 are opposite from each other at the focal plane F where the 0-th sub-laser beam 0, the (+1)-th sub-laser beam +1, and the (−1)-th sub-laser beam −1 encounter, the destructive interference may be generated to uniformize the intensity of the laser beam B.

A distance L between the triangular lattice 22 and the focal plane F may be changed by controlling the density of grooves in the triangular lattice 22 and the width of each groove in the triangular lattice 22. Intensities of the 0-th sub-laser beam 0, the (+1)-th sub-laser beam +1, and the (−1)-th sub-laser beam −1 may be changed by controlling the inclination 0 of each groove in the triangular lattice 22.

Figure 5:
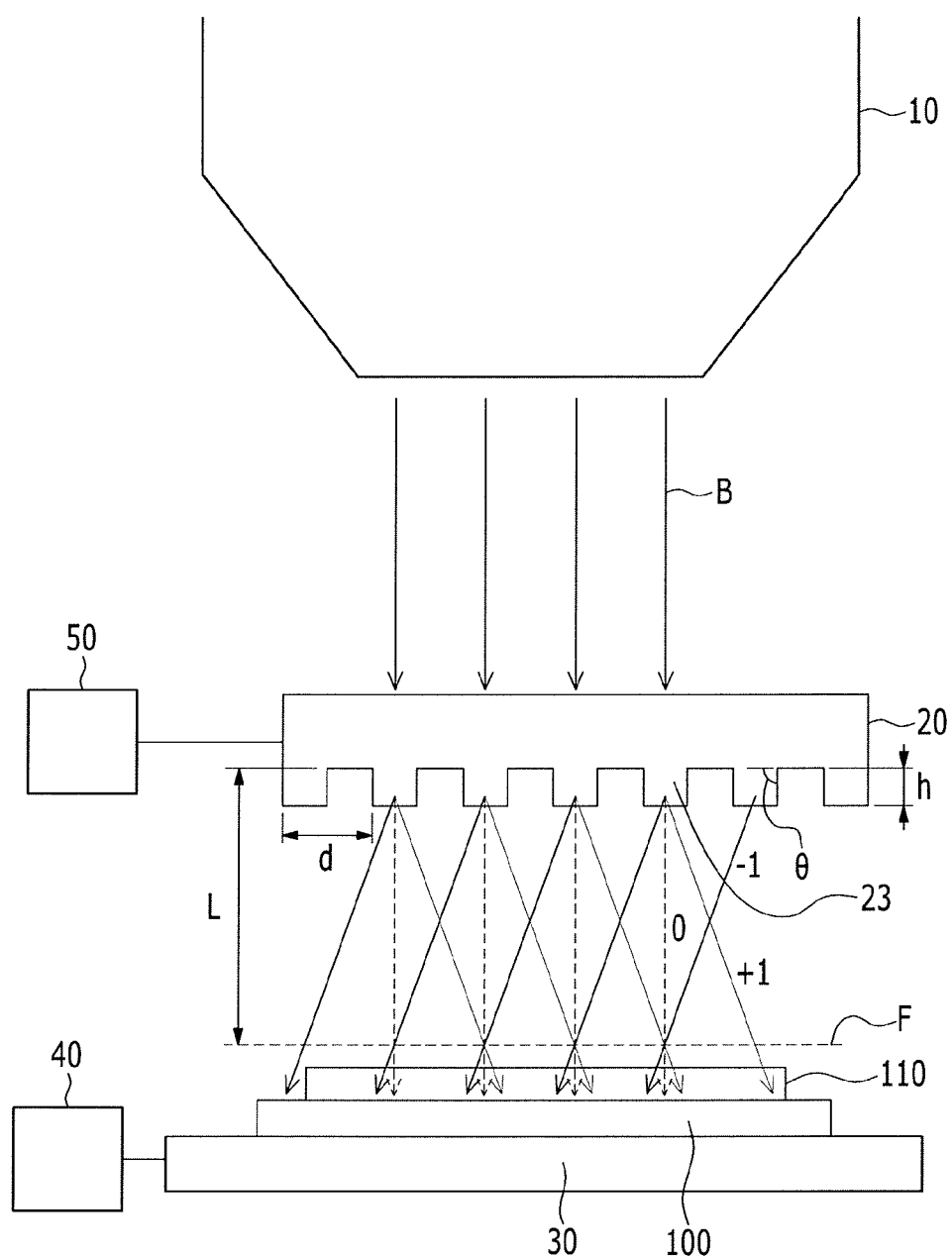
FIG. 5 is a schematic diagram of a laser crystallization apparatus according to an exemplary embodiment of the present invention.

Referring to FIG. 5, a laser crystallization apparatus 3 according to an exemplary embodiment of the present invention may be equivalent to the laser crystallization apparatus 1 of FIG. 1 except for a shape of the refraction lattice, and accordingly, a description of similar features may be omitted. The laser crystallization apparatus 3 may include a quadrangular lattice 23 including quadrangular grooves, and the density of grooves in the quadrangular lattice 23 may be in the range from 50/mm to 200/mm. When the density of grooves of the quadrangular lattice 23 is less than 50/mm, it may be difficult to sufficiently refract the laser beam B to uniformize an intensity of the laser beam B. When the density of grooves in the quadrangular lattice 23 is more than 350/mm, the manufacturing process may become difficult and the cost of manufacturing may increase.

A width (d) of each groove of the quadrangular lattice 23 may be in a range from 3 μm to 20 μm. When the width (d) of each groove in the quadrangular lattice 23 is less than 3 μm, the manufacturing process may become difficult and the cost of manufacturing may increase. When the width (d) of each groove in the quadrangular lattice 23 is larger than 20 μm, it may be difficult to generate the refraction. The laser beam B incident to the refraction optical system 20 may be divided into a plurality of sub-laser beams (−1, 0, +1) while passing through the refraction optical system 20. When the refraction optical system 20 is the quadrangular lattice 23, the laser beam B may be divided into a 0-th sub-laser beam 0, a (+1)-th sub-laser beam +1, and a (−1)-th sub-laser beam −1.

A depth (h) of each groove in the quadrangular lattice 23 may be in a range from 0.1 μm to 20 μm. When the depth (h) of each grooves in the quadrangular lattice 23 is less than 0.1 μm, the intensity of the 0-th sub-laser beam 0 may be increased compared with the other sub-laser beams (e.g., (+1)-th sub-laser beam +1 and (−1)-th sub-laser beam −1) so that the uniformity of the intensity may be deteriorated. When the depth (h) of each groove in the quadrangular lattice 23 is larger than 20 μm, the manufacturing process may become difficult and the cost of manufacturing may increase.

A path difference may be generated among the 0-th sub-laser beam 0, the (+1)-th sub-laser beam +1, and the (−1)-th sub-laser beam −1 through the refraction optical system 20. When the phases of the 0-th sub-laser beam 0, the (+1)-th sub-laser beam +1, and the (−1)-th sub-laser beam −1 are opposite from each other at the focal plane F where the 0-th sub-laser beam 0, the (+1)-th sub-laser beam +1, and the (−1)-th sub-laser beam −1 meet, the destructive interference may be generated to uniformize the intensity of the laser beam B.

A distance L between the quadrangular lattice 23 and the focal plane F may be changed by controlling the density of grooves in the quadrangular lattice 23 and controlling the width of each groove in the quadrangular lattice 23. Intensities of the 0-th sub-laser beam 0, the (+1)-th sub-laser beam +1, and the (−1)-th sub-laser beam −1 may be changed by controlling the inclination 0 of each groove in the triangular lattice 22.

The refraction optical system 20 in FIGS. 1, 4, and 5 may be vibrated during operation.

Figure 6:
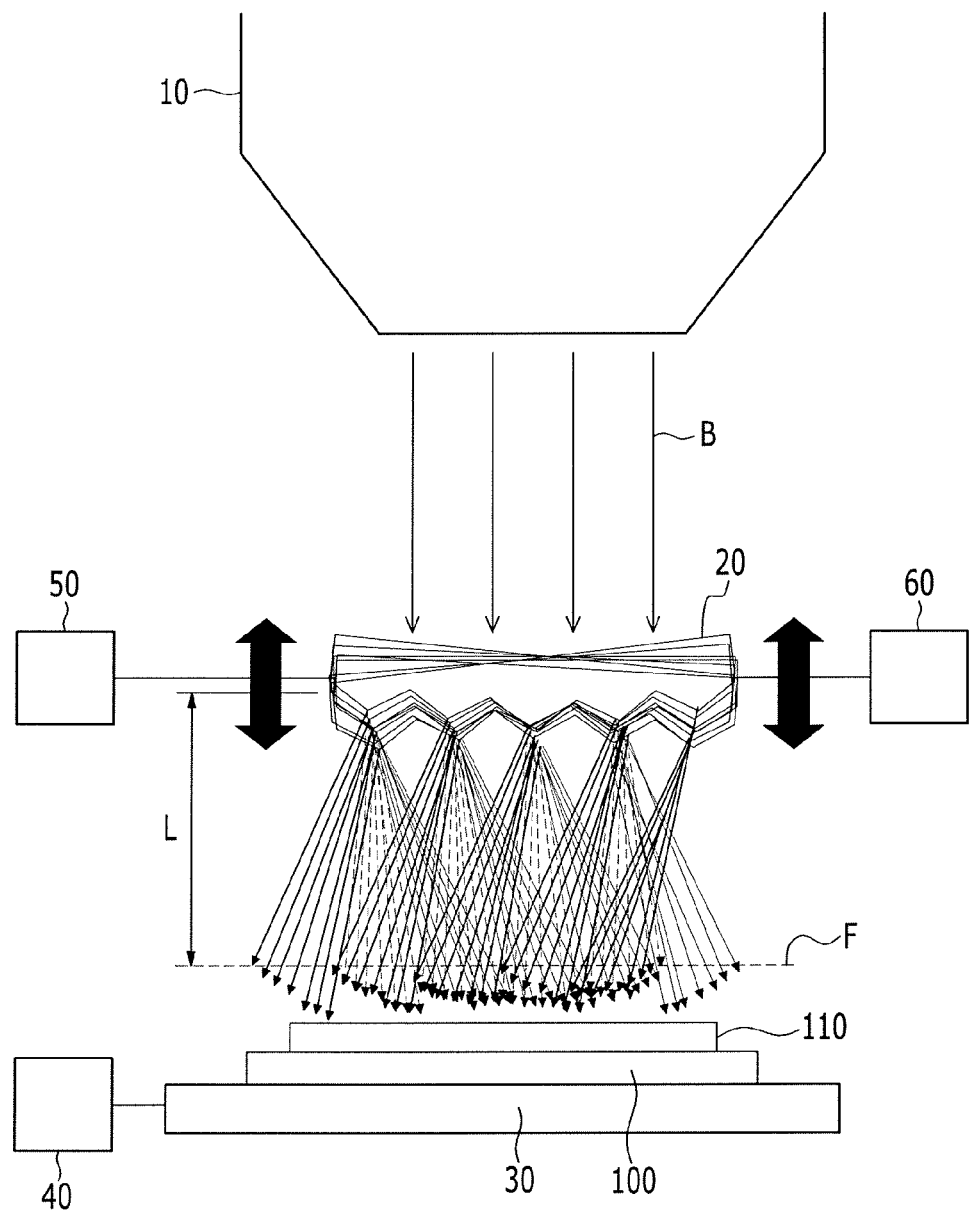
FIG. 6 is a schematic diagram of a laser crystallization apparatus according to an exemplary embodiment of the present invention.

Referring to FIG. 6, a laser crystallization apparatus 4 according to an exemplary embodiment of the present invention may be substantially equivalent to a laser crystallization apparatus of FIG. 1, 4, or 5 except for a high frequency generator 60. Accordingly, a description of similar features may be omitted.

Referring to FIG. 6, a laser crystallization apparatus 4 may include a laser generator 10 configured to generate a laser beam B, a refraction optical system 20 configured to refract the laser beam B, a stage 30 mounted with an object substrate 100, a stage elevator 40 configured to move the stage 30, a refraction optical system elevator 50 configured to move the refraction optical system 20, and a high frequency generator 60, connected to the refraction optical system 20, configured to vibrate the refraction optical system 20.

A high frequency generated in the high frequency generator 60 may vibrate the refraction optical system 20 with respect to the mass center of the refraction optical system 20 to disperse the refracted sub-laser beams, so that the uniformity of the intensity of laser beam B may be increased.

A frequency generated in the high frequency generator 60 may be in a range from 25 Hz to 200 Hz. When the frequency is less than 25 Hz, the vibration may be too weak to uniformize the intensity of the laser beam B. When the frequency is more than 200 Hz, the vibration may be so large to be transmitted to the object substrate 100, and a mura may be generated.

Figure 7:
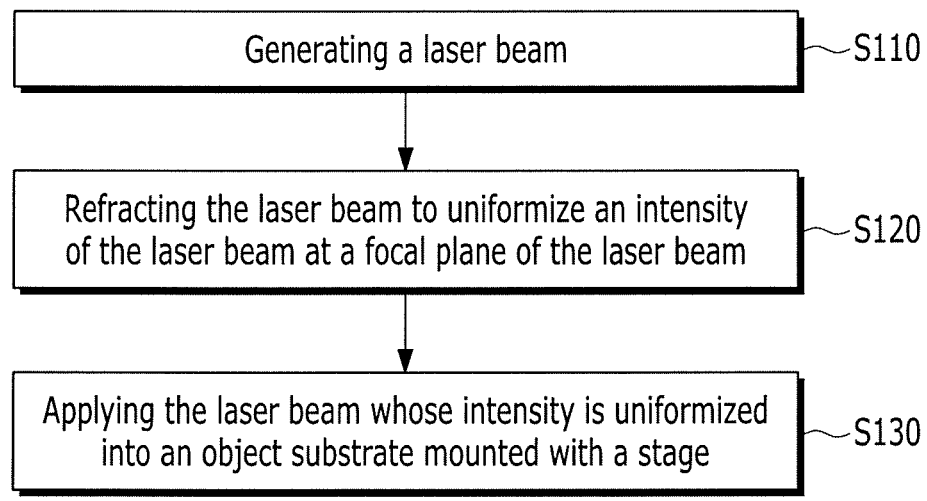
FIG. 7 is a flow chart illustrating a method for performing a laser crystallization according to an exemplary embodiment of the present invention.

FIG. 7 is a flow chart illustrating a method of performing a laser crystallization according to an exemplary embodiment of the present invention.

Referring to FIG. 7, a method for performing a laser crystallization according to an embodiment of the present invention may include generating a laser beam (S110), refracting the laser beam by using a refraction optical system to uniformize an intensity of the laser beam at a focal plane of the laser beam (S120), and applying the laser beam whose intensity is uniformized into an object substrate mounted with a stage (S130).

In S120, the refractive optical system may be a refraction lattice lens in which a refraction lattice including a plurality of grooves is formed at one surface thereof. The refraction lattice may be a saw-toothed lattice including a plurality of saw-toothed grooves. The refraction lattice may be a triangular lattice including a plurality triangular grooves. The refraction lattice may be a quadrangular lattice including a plurality of quadrangular grooves.

In S130, the step of applying the laser beam may include moving the stage for positioning the focal plane onto an object thin film formed at the object substrate. The step of applying the laser beam may include moving the refraction optical system for positioning the focal plane onto an object thin film formed at the object substrate.

While this invention has been particularly shown and described with reference to exemplary embodiments thereof, it will be understood by those of ordinary skill in the art that various modifications in form and details may be made without departing from the spirit and scope of the inventive concept as defined by the following claims.

What is claimed is:

1. A method for performing a laser crystallization comprising:
   generating a laser beam;
   refracting the laser beam to uniformize an intensity of the laser beam at a focal plane of the laser beam by using a refraction optical system; and
   applying the laser beam whose intensity is uniformized into an object substrate mounted with a stage,
   wherein the refraction optical system includes a refraction lattice lens,
   wherein a refraction lattice including a plurality of grooves is formed at a first surface of the refraction lattice lens, and
   wherein the plurality of grooves formed at the first surface of the refraction lattice lens is arranged in a first direction with respect to each other, the first direction crossing a second direction in which the laser beam is incident to the refraction optical system.

2. The method for performing a laser crystallization of claim 1, wherein the refraction lattice is a saw-toothed lattice and the plurality of grooves includes saw-toothed grooves.

3. The method for performing a laser crystallization of claim 2, wherein a density of the saw-toothed grooves within the saw-toothed lattice is in a range from 50/mm to 350/mm.

4. The method for performing a laser crystallization of claim 2, wherein a width of each of the saw-toothed grooves is in a range from 3 μm to 20 μm.

5. The method for performing a laser crystallization of claim 1, wherein the refraction lattice is a triangular lattice and the plurality of grooves includes triangular grooves.

6. The method for performing a laser crystallization of claim 5, wherein a density of the triangular grooves within the triangular lattice is in a range from 50/mm to 350/mm.

7. The method for performing a laser crystallization of claim 6, wherein a width of each of the triangular grooves is in a range from 3 μm to 20 μm.

8. The method for performing a laser crystallization of claim 1, wherein the refraction lattice is a quadrangular lattice and the plurality of grooves includes quadrangular grooves.

9. The method for performing a laser crystallization of claim 8, wherein a density of the quadrangular grooves within the quadrangular lattice is in a range from 50/mm to 350/mm.

10. The method for performing a laser crystallization of claim 8, wherein a width of each of the quadrangular grooves is in a range from 3 μm to 20 μm.

11. The method for performing a laser crystallization of claim 8, wherein a depth of each of the quadrangular grooves is in a range from 0.1 μm to 20 μm.

12. The method for performing a laser crystallization of claim 1, further comprising
   vibrating the refraction optical system using a high frequency generator.

13. The method for performing a laser crystallization of claim 12, wherein a frequency generated by the high frequency generator is in a range from 60 Hz to 100 Hz.

14. The method for performing a laser crystallization of claim 1, wherein the applying the laser beam includes moving the stage to position the focal plane onto an object thin film disposed at the object substrate.

15. The method for performing a laser crystallization of claim 1, wherein the applying the laser beam includes moving the refraction optical system to position the focal plane onto an object thin film disposed at the object substrate.

16. The method for performing a laser crystallization of claim 12, wherein the vibrating of the refraction optical system using the high frequency generator is performed to increase uniformity of the intensity of the laser beam.

* * * * *